(12) United States Patent
Buuck et al.

(10) Patent No.: US 9,019,720 B1
(45) Date of Patent: *Apr. 28, 2015

(54) HEIGHT REDUCTION IN PORTABLE DEVICES

(71) Applicant: Amazon Technologies, Inc., Reno, NV (US)

(72) Inventors: David C. Buuck, Prunedale, CA (US); Chris T. Li, Fremont, CA (US)

(73) Assignee: Amazon Technologies, Inc., Reno, NV (US)

( * ) Notice: Subject to any disclaimer, the term of this patent is extended or adjusted under 35 U.S.C. 154(b) by 198 days.

This patent is subject to a terminal disclaimer.

(21) Appl. No.: 13/674,744

(22) Filed: Nov. 12, 2012

Related U.S. Application Data

(63) Continuation of application No. 12/720,003, filed on Mar. 9, 2010, now Pat. No. 8,310,842.

(51) Int. Cl.
| | |
|---|---|
| *H05K 7/02* | (2006.01) |
| *H05K 7/04* | (2006.01) |
| *H05K 7/00* | (2006.01) |
| *H04R 1/02* | (2006.01) |
| *H05K 7/06* | (2006.01) |

(52) U.S. Cl.
CPC ............... *H05K 7/005* (2013.01); *H04R 1/028* (2013.01); *H05K 7/06* (2013.01)

(58) Field of Classification Search
USPC ......................... 361/814, 728–730
See application file for complete search history.

(56) References Cited

U.S. PATENT DOCUMENTS

| | | |
|---|---|---|
| 5,739,596 A | 4/1998 | Takizawa et al. |
| 6,285,159 B1 | 9/2001 | Ki et al. |
| 6,937,464 B2 | 8/2005 | Adams et al. |
| 7,136,682 B2 | 11/2006 | Lin |
| 7,236,356 B2 | 6/2007 | Ulla et al. |
| 7,277,239 B2 * | 10/2007 | Carnevali ..................... 359/802 |
| 7,626,358 B2 | 12/2009 | Lam et al. |
| 7,634,606 B2 | 12/2009 | Kimchi et al. |
| 7,705,799 B2 | 4/2010 | Niwa |
| 8,018,431 B1 | 9/2011 | Zehr et al. |
| 8,061,182 B2 * | 11/2011 | Weber et al. ................. 73/12.06 |
| 8,310,457 B2 * | 11/2012 | Faubert et al. ................ 345/173 |
| 8,310,842 B1 * | 11/2012 | Buuck et al. .................. 361/814 |
| 2009/0284225 A1 | 11/2009 | Nakanuma et al. |

OTHER PUBLICATIONS

U.S. Appl. No. 12/720,003, filed Mar. 9, 2010, David C. Buuck et al., "Height Reduction in Portable Devices".

Non-Final Office Action for U.S. Appl. No. 12/720,003, mailed on Jan. 23, 2012, David C. Buuck et al., "Height Reduction in Portable Devices", 10 pages.

\* cited by examiner

*Primary Examiner* — Hung S Bui

(74) *Attorney, Agent, or Firm* — Lee & Hayes, PLLC

(57) ABSTRACT

Components within a portable device are arranged around a perimeter of a display component to reduce the height of the portable device. Components such as a battery, a main logic board, a wireless networking interface, and so forth may be distributed around a display component such as an electrophoretic display. Distribution of components around the perimeter of the display component rather than behind the display component reduces the height. Furthermore, the placement of components in the perimeter provides a structure for a user to grip the portable device or for placement of user actuable controls.

23 Claims, 6 Drawing Sheets

180
HEIGHT REDUCTION IN PORTABLE DEVICES

CROSS-REFERENCE TO RELATED APPLICATION

This application is a continuation of, and claims priority to, co-pending U.S. patent application Ser. No. 12/720,003, filed Mar. 9, 2010, to inventors David C. Buuck, et al. The entire contents of the above Application are incorporated herein by reference.

BACKGROUND

Mobile users increasingly demand electronic devices having smaller and smaller form factors (that is, an overall size of the device). Electronic devices such as cellular phones, portable media players, table computers, netbooks, laptops, electronic book readers, and so forth have traditionally been bulky, particularly along the "Z" axis, or height of the device.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Mobile users increasingly demand electronic devices having smaller and smaller form factors (that is, an overall size of the device). Electronic devices such as cellular phones, portable media players, table computers, netbooks, laptops, electronic book readers, and so forth have traditionally been bulky, particularly along the "Z" axis, or height. For purposes of illustration, and not by way of limitation, the "Z" axis may be considered an axis extending through the device which is orthogonal to a plane defined by the length and width of a display component of the device. This bulk sometimes results from the placement of components behind the display component, resulting in multiple layers of components that increase the size of the device along the "Z" axis.

This disclosure describes, in part, reduced-height devices and techniques for assembling these reduced-height devices, where active components are distributed around at least one side of, and approximately coplanar with, a display component. Active components include those which consume, store, or produce electrical power. For example, batteries, processors, memory, and so forth are active components. Non-active components include those which do not consume, store, or produce electrical power, such ground planes, enclosures, interconnections, and so forth.

Illustrative Reduced-Height Device

Figure 1:
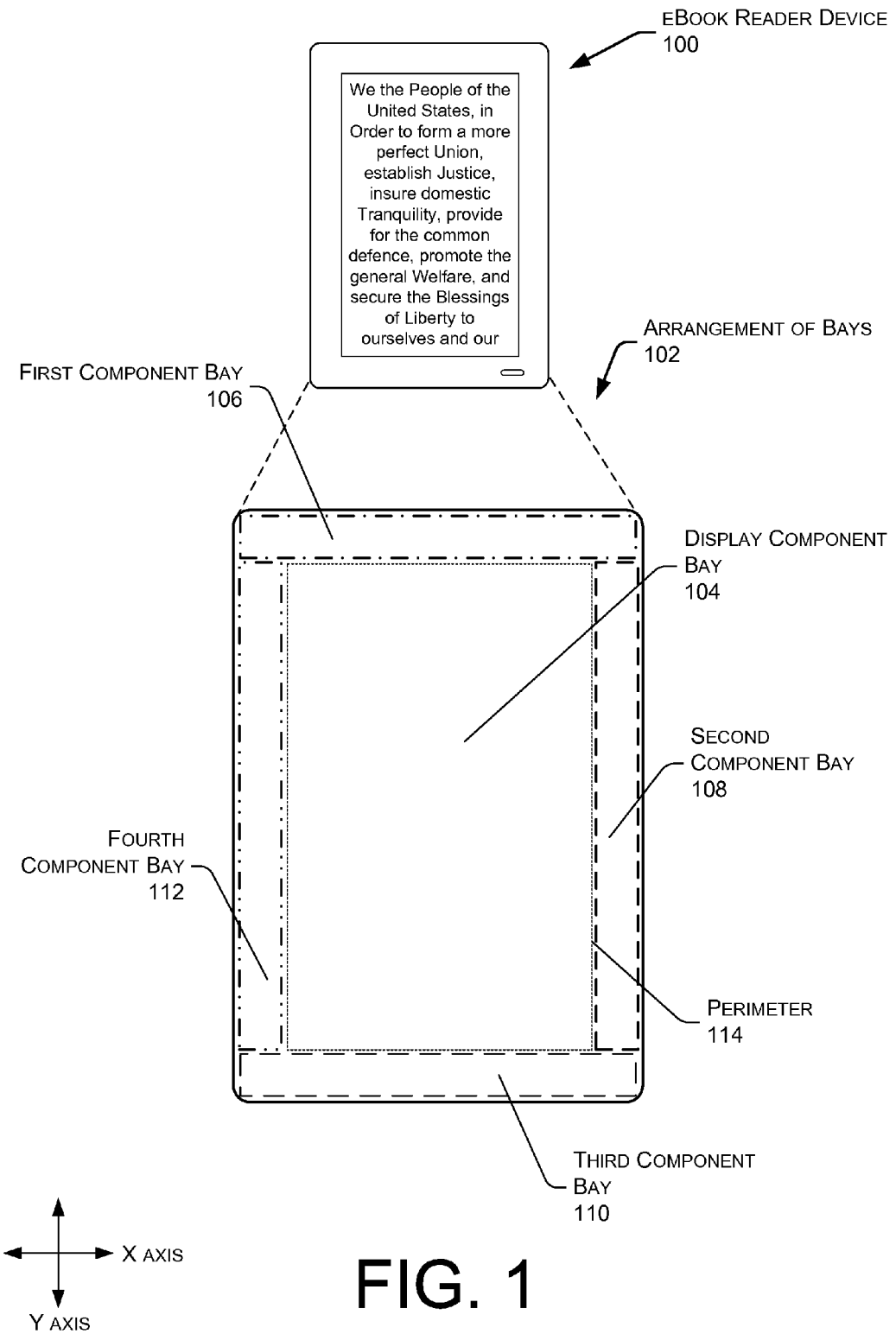
FIG. 1 is an illustrative reduced-height electronic book (eBook) reader device configured with component bays distributed around a perimeter of a display component bay.

FIG. 1 is an illustrative reduced-height electronic device, such as an (electronic book) eBook reader device 100 configured with component bays distributed around the perimeter of a display component bay. FIG. 1 illustrates, at 102, an enlarged arrangement of internal component bays within the eBook reader device 100. A component bay represents a specified volume configured to accept one or more components. This specified volume may be fully or partially enclosed or defined by the placement of adjacent components, structures, and so forth when the device is assembled. A component bay may contain a single component, such as a display, or multiple components such as a circuit board and a battery.

While FIG. 1 and proceeding figures illustrate an eBook reader device 100, other devices may similarly utilize the reduced height techniques described herein. These devices include cellular phones, portable media players, tablet computers, netbooks, laptops, and so forth.

A display component bay 104 is shown in a generally central location of the eBook reader device 100. In other implementations, the display component bay 104 may be located in a non-central location. Display component bay 104 may contain a display component, as described below with respect to FIG. 2.

As illustrated, several example component bays are distributed around a perimeter 114 of the display component bay 104. These bays include a first component bay 106, a second component bay 108, a third component bay 110, and a fourth component bay 112. As shown in this illustration, these bays may be distributed above, to the right, below, and to the left, respectively, of the display component bay 104. While FIG. 1 and proceeding figures illustrated four component bays arranged in this manner, other implementations may employ any other number of one or more component bays, arranged in any other fashion.

As described in detail immediately below, components may be placed within the component bays 106-110 along the perimeter 114 of the display component bay 104, rather than behind the display component bay 104. Placing components in the device 100 in this manner reduces the height of the eBook reader device 100. Furthermore, this placement provides a structure for a user to grip the portable device, or for placement of user actuable controls.

Figure 2:
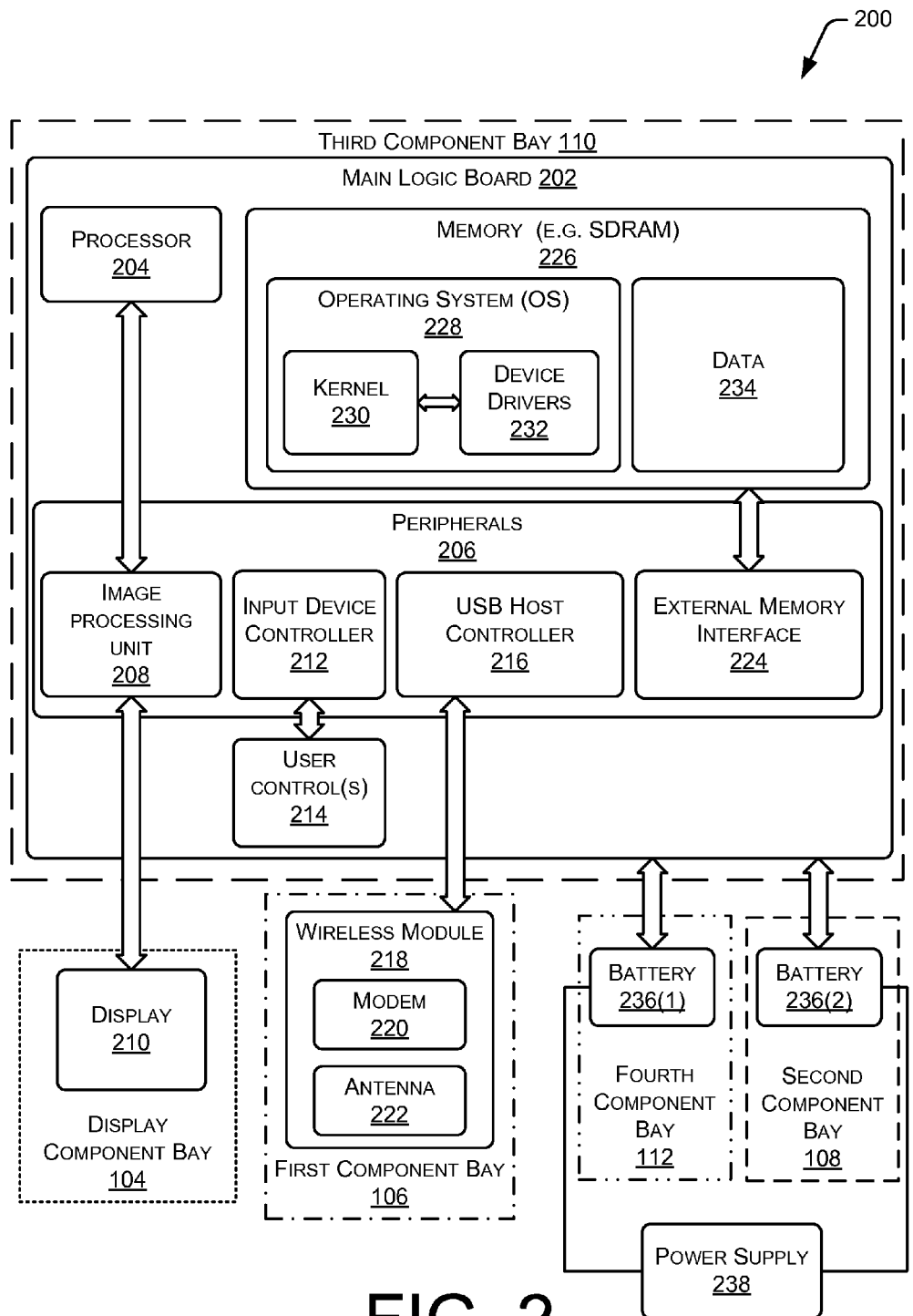
FIG. 2 is an illustrative schematic of an electronic device showing distribution of components into the example component bays of FIG. 1.

FIG. 2 is an illustrative schematic 200 of an electronic device, such as the eBook reader device 100, showing components and their distribution into the component bays. While this figure illustrates certain components in certain bays, these components may reside in any other combination of one or more component bays in any other manner in different implementations.

In a very basic configuration, the device 100 includes a backplane such as a main logic board 202 comprising components such a processor 204 and one or more peripherals 206. Each processor 204 may itself comprise one or more processors. In this example, the main logic board 202 may be located within the third component bay 110, below the display component bay 104. The backplane may comprise a printed circuit board or other substrate to which one or more components are affixed.

Peripherals 206 may be coupled to the processor 204. In some implementations, at least some of the peripherals 206 may be located on the main logic board 202. An image processing unit 208 is shown on the main logic board 202 coupled to one or more display components 210 (or "displays"). In this example, this display 210 is located within display component bay 104 of eBook reader device 100. In some implementations, multiple displays may be present and coupled to the image processing unit 208. These multiple displays may be located in the same or different component bays. Furthermore, one or more image processing units 208 may couple to the multiple displays.

Display 210 may present content in a human-readable format to a user. The display 210 may be reflective, emissive, or a combination of both. Reflective displays utilize incident light and include electrophoretic displays, interferometric modulator displays, cholesteric displays, and so forth. Emissive displays do not rely on incident light and, instead, emit light. Emissive displays include backlit liquid crystal displays, time multiplexed optical shutter displays, light emitting diode displays, and so forth. When multiple displays are present, these displays may be of the same or different types. For example, one display may be an electrophoretic display while another may be a liquid crystal display.

The content presented on the display 210 may take the form of electronic books or "eBooks." For example, the display 210 may depict the text of the eBooks and also any illustrations, tables, or graphic elements that might be contained in the eBooks. The terms "book" and/or "eBook", as used herein, include electronic or digital representations of printed works, as well as digital content that may include text, multimedia, hypertext, and/or hypermedia. Examples of printed and/or digital works include, but are not limited to, books, magazines, newspapers, periodicals, journals, reference materials, telephone books, textbooks, anthologies, instruction manuals, proceedings of meetings, forms, directories, maps, web pages, and so forth. Accordingly, the terms "book" and/or "eBook" may include any readable or viewable content that is in electronic or digital form.

The display 210 may further include touch screen capabilities that allow user input through contact or gesturing relative to the display. For convenience only, the display 210 is shown in a generally rectangular configuration. However, it is understood that the display 210 may be implemented in any shape, and may have any ratio of height to width. For example, in some implementations the display 210 may be substantially polygonal, while in other implementations the display 210 may be substantially elliptical. Also, for stylistic or design purposes, the display 210 may be curved or otherwise non-linearly shaped. Furthermore, display 210 may be flexible and configured to fold or roll.

A plane of the display 210 may be defined by the length and width of the display 210. For example, in one implementation the display 210 may be about 250 millimeters long (as measured along the Y axis), about 200 mm wide (as measured along the X axis), and about 1 mm high (as measured along the Z axis). Thus, the plane of the display 210 is defined by the axis which is 250 mm long and the axis which is 200 mm wide. In other words, the plane is defined by the top two longest linear dimensions of the display which are orthogonal to one another in this implementation. The perimeter of the display 210 comprises the edges of the display 210 within this plane.

A front of the display 210 is the portion of the display upon which an image is presented for viewing by a user, as contrasted with a back of the display. As described above, the perimeter includes the edges of the plane, and not the front or back of the display.

EBook reader device 100 may have an input device controller 212 configured to accept input from a touchscreen, keypad, keyboard, or other user actuable controls 214. These user actuable controls 214 may have dedicated or assigned operations. For instance, the actuatable controls 112 may include page turning buttons, a joystick, navigational keys, a power on/off button, selection keys, joystick, touchpad, and so on. User controls 214 may be located on the main logic board 202 or on other circuit boards or structures within the eBook reader device 100.

A USB host controller 216 may also be located on the main logic board 202. USB host controller 216 manages communications between devices attached to a universal serial bus ("USB") and the processor 204 and other peripherals.

The USB host controller 216 may be coupled to a wireless module 218 via the universal serial bus. Wireless module 218 may allow for connection to wireless local or wireless wide area networks ("WWAN"). Wireless module 218 may include a modem 220 configured to send and receive data wirelessly and one or more antennas 222 suitable for propagating a wireless signal. In other implementations, a wired network interface may be provided. As illustrated here, wireless module 218 may be located in the first component bay 106.

An external memory interface ("EMI") 224 located on main logic board 202 is also shown coupled to external memory 226. The EMI 224 manages access to data stored in external memory 226. The external memory 226 may comprise Static Random Access Memory ("SRAM"), Pseudo-static Random Access Memory ("PSRAM"), Synchronous Dynamic Random Access Memory ("SDRAM"), Double Data Rate SDRAM ("DDR"), Phase-Change RAM ("PCRAM"), or other computer readable storage media. External memory 226 may be located on main logic board 202 as shown, on another circuit board, or a combination of the two.

The external memory 226 may also store data 234, which may comprise content objects for consumption on eBook reader device 100, executable programs, databases, user settings, configuration files, device status, and so forth. Thus, the external memory 226 may store an operating system 228 comprising a kernel 230 operatively coupled to one or more device drivers 232. Device drivers 232 are also operatively coupled to peripherals 206. Furthermore, eBook reader device 100 may include one or more other, non-illustrated peripherals, such as a hard drive using magnetic, optical, or solid state storage to store information, a firewire bus, a Bluetooth™ wireless network interface, camera, global positioning system, PC Card component, and so forth.

One or more batteries 236(1), . . . , 236(N) provide operational electrical power to components of the eBook reader device 100 when disconnected from an external power supply 238. Operational electrical power is sufficient to provide for operation of the device, as distinguished from the lesser electrical power requirements of a sleep or state retention mode. Power supply 238 may be internal or external to the eBook reader device 100. Power supply 238 is configured to provide operational power for eBook reader device 100, charge batteries 236(1)-(N), or both.

One or more batteries 236 may also reside within one or more component bays of eBook reader device 100. In this illustration, a battery 236(1) is located within the fourth component bay 112 to the left of the display component bay 104 while a battery 236(2) is located within the second component bay 108 to the right of the display component bay 104.

Couplings, such as between input device controller 212 and user controls 214, are shown for emphasis. There are couplings between many of the components illustrated in FIG. 2, but graphical arrows are omitted for clarity of illustration.

Figure 3:
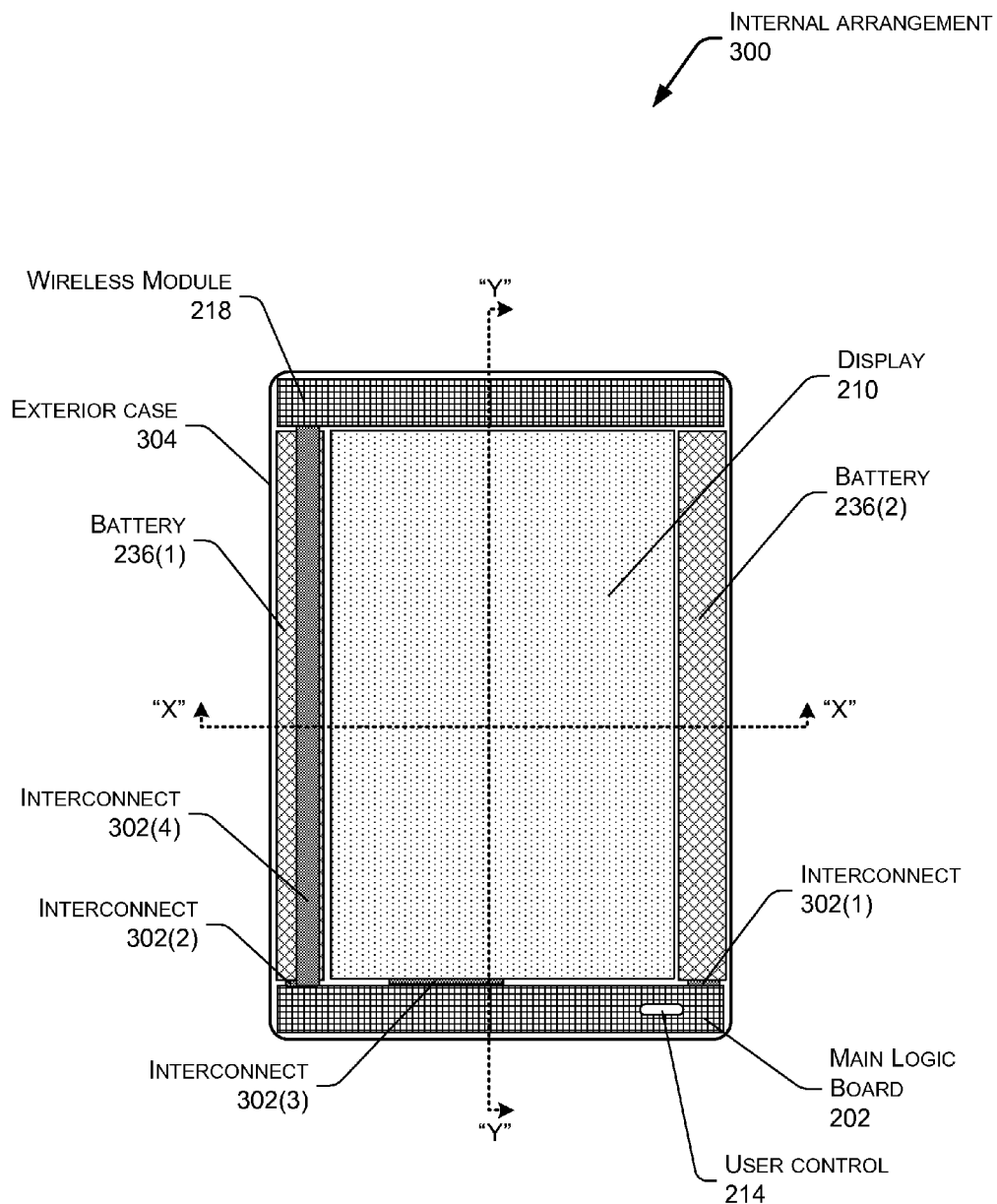
FIG. 3 is an illustration of an example internal arrangement of components of the eBook reader device of FIG. 1 within the example component bays.
Figure 3:
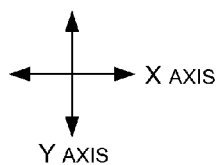

FIG. 3 is an illustration of an example internal arrangement 300 eBook reader device of FIG. 1 showing placement of components within the several component bays 104-112. As illustrated, display 210 resides within display component bay 104. The remaining components of the device are distributed around the perimeter of the display component bay 104, and thus the display 210. For instance, wireless module 218 is located within the first component bay 106 above display 210. To the right of display 210, battery 236(2) resides within the second component bay 108. Main logic board 202 is located below display 210 within the third component bay 110. As illustrated, a user control 214, such as a power button, sits atop the main logic board 202. Battery 236(1) is located within the fourth component bay 112 to the left of display 210. While single components such as battery 236, or component assemblies such as main logic board 202 are shown occupying a single component bay, in some implementations multiple components or component assemblies may share a component bay. For example, the first component bay 104 may contain a wireless module 218 and a battery 236.

FIG. 3 also illustrates that the device may include one or more interconnects 302, which provide pathways for coupling components located in different component bays. The interconnects may include an electrical conductor, an optical path, electromagnetic waveguides, fluidic channels, magnetic couplings, mechanical couplings, and so forth. For example, interconnects 302(1) and 302(2) provide an electrical connection between batteries 236(2) and 236(1), respectively, and main logic board 202. An interconnect 302(3) couples display 210 with main logic board 202, while an interconnect 302(4) provides a coupling between the main logic board 202 and the wireless module 218. In some implementations, interconnects may be integral to components. For example, the packaging of the battery 236(1) may incorporate electrical conductors suitable to act as interconnect 302(4). In another example, layers within the display 210 may provide interconnects 302. Interconnects 302 may be rigid, flexible, elastomeric, and so forth. These interconnects are non-active components, in that their primary function is not to consume, store, or produce electrical power, optical signals, electromagnetic radiation, and so forth.

Interconnects may be arranged to pass at least partially in front of, behind, or otherwise proximate to components. For example, the interconnect 302(4) between the main logic board 202 and the wireless module 218 may run approximately parallel with the battery 236(1) as shown in FIG. 3. In another example, the interconnect 302(4) may be routed at least partially behind the display 210.

An exterior case 304 at least partially encloses the components. The exterior case may be a pre-existing structure of one or more parts, configured to accept the components. In other implementations, the components may be encased at least partially in an encapsulating material, for example, a plastic or epoxy.

Also indicated in this cross section is a front of the display 306 and a back of the display 308. As described above, the front of the display 306 is the portion of the display upon which an image is presented for viewing by the user, as contrasted with a back of the display 308. In some implementations the display 210 may be multi-sided, and provide images for viewing by the user on both the front of the display 306 and the back of the display 308.

FIG. 3 also illustrates cross sectional lines "X" and "Y." Cross sectional line "X" is depicted at approximately the middle of the device and is perpendicular to the long axes of the display component bay 104, second component bay 108, and fourth component bay 112. Cross sectional line "Y" is depicted at approximately the center of the device and is perpendicular to the cross sectional line "X."

Figure 4:
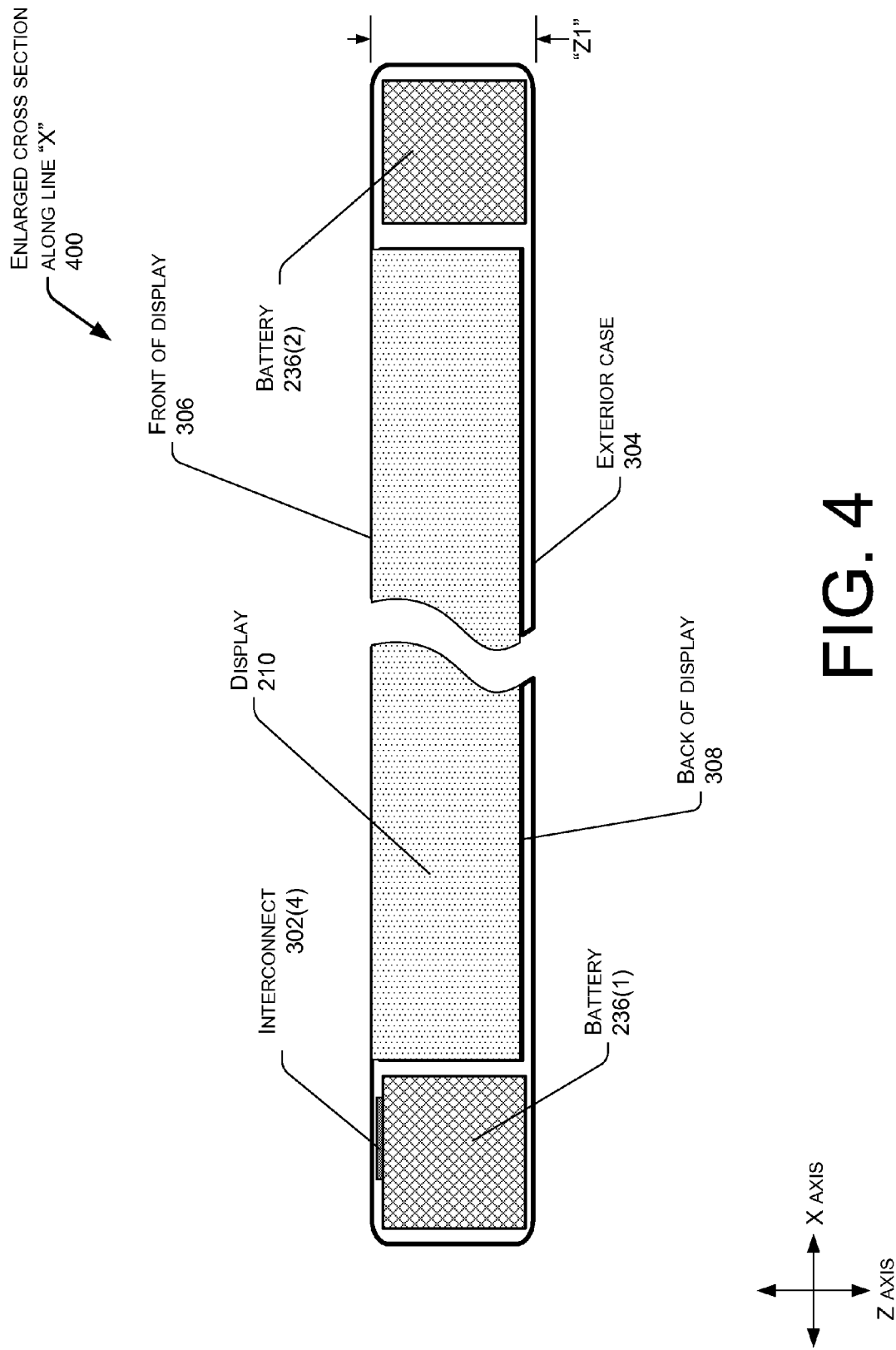
FIG. 4 is an illustration of an enlarged cross section of the eBook reader device of FIG. 3 along line "X."

FIG. 4 is an illustration of an enlarged cross section 400 of the eBook reader device of FIG. 3 along line "X." In this cross section, battery 236(1) is visible, as is interconnect 302(4), which routes parallel to a longest axis of battery 236(1). Display 210 is positioned between battery 236(1) and battery 236(2). Dimension "Z1" indicates the overall height of the device along this cross sectional line "X." By placing components to the side of display 210 rather than underneath, the overall height "Z1" is reduced, resulting in a very slim profile compared to traditional devices that stack components within the "Z" axis.

As illustrated, the component bays and components therein are approximately coplanar with the display component bay and, thus, with the display 210. The component bays are deemed approximately coplanar when they are less than perpendicular to the display component bay. Furthermore, while coplanar, the components need not be of the same height. For example, battery 236(1) may be 1.5 millimeters (mm) high, while battery 236(2) may be 1.6 mm high and display 210 may be 1.55 mm high. Of course, these components may have any other height, depending upon the implementation.

Figure 5:
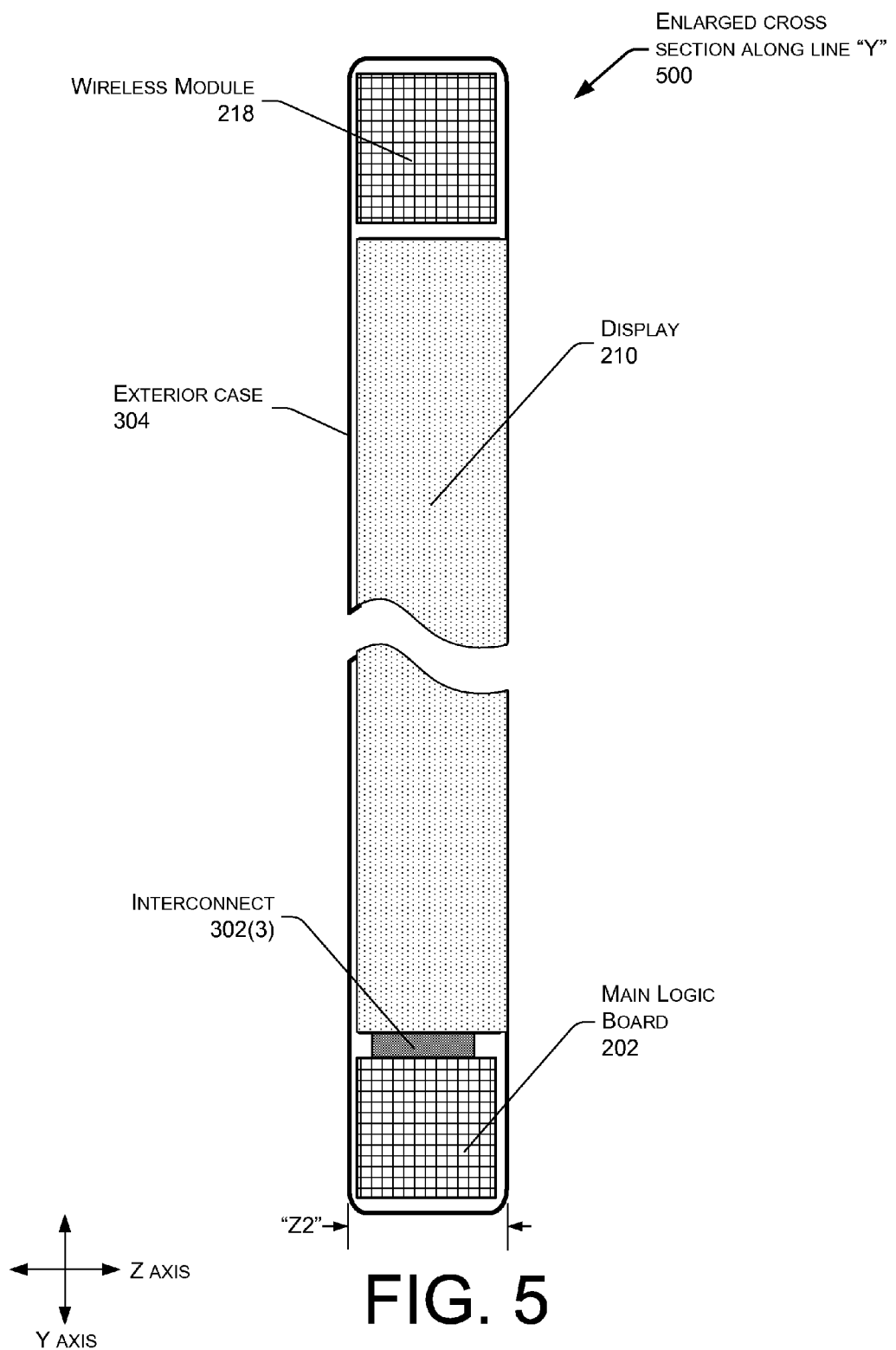
FIG. 5 is an illustration of an enlarged cross section of the eBook reader device of FIG. 3 along line "Y."

FIG. 5 is an illustration of an enlarged cross section 500 of the eBook reader device of FIG. 3 along line "Y." In this cross section, wireless module 218 is shown above display 210, while main logic board resides under display 210. Interconnect 302(2), which couples display 210 and main logic board 202, is also shown. Here, a dimension "Z2" indicates the overall height of the device along the cross sectional line "Y." In the eBook reader device 100, dimensions "Z1" and "Z2" Are approximately equal in size, while in other implementations Z1 and Z2 may differ.

Illustrative Process for Assembling a Reduced Height Device

Figure 6:
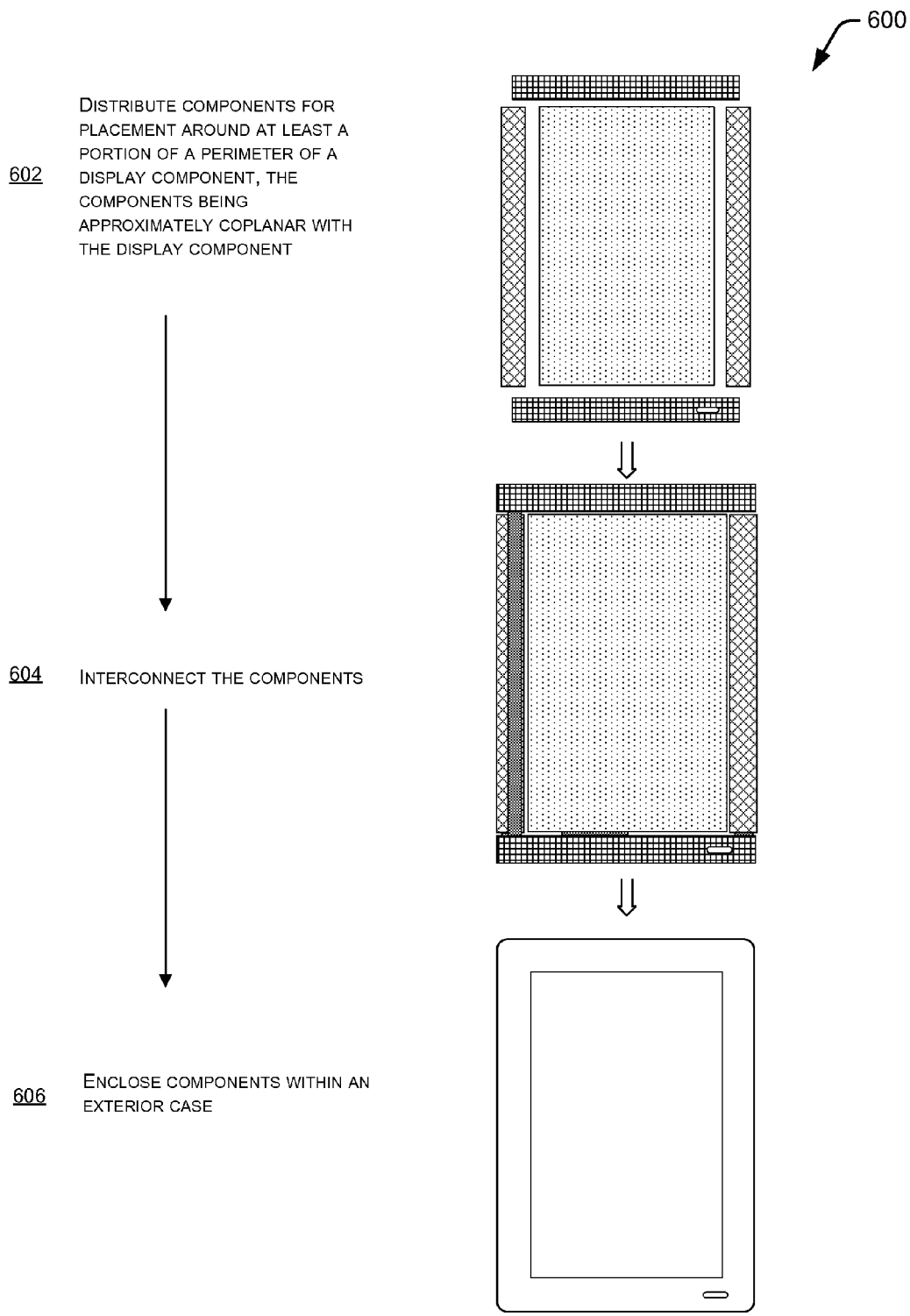
FIG. 6 is an illustrative process of assembling a reduced height electronic device.

FIG. 6 illustrates an example process 600 that may be implemented by the architecture of FIGS. 1-5 or by other architectures. This process is illustrated as a collection of blocks in a logical flow graph, which represent a sequence of operations that can be implemented in hardware, software, or a combination thereof. In the context of software, the blocks represent computer-executable instructions that may be stored on one or more computer-readable storage media and that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order or in parallel to implement the processes.

FIG. 6 is an illustrative process 600 of assembling a reduced height electronic device. Operation 602 distributes components for placement within one or more component bays disposed around at least a portion of a perimeter of a display component bay. In one example, the one or more component bays are approximately coplanar with the display component bay. In some implementations, component bays are deemed approximately coplanar with the display component bay when they are substantially parallel to the display component bay (e.g., within a 45° angle of the display component bay, a 30° angle, a 5° angle, etc.). While shown distributed around all four sides of the display component bay, the remaining component bays may be disposed around one, two, or three sides of the display component bay in some implementations. Components may be distributed manually, using a pick-and-place device or other automated equipment, or a combination of both.

Operation 604 interconnects the components. Interconnection may be accomplished via soldering, mechanical insertion, physical contact, adhesion, and so forth. As described above, interconnections provide a coupling between two or more components. Interconnection may be accomplished manually, using a pick-and-place device or other automated equipment, or a combination of both.

Operation 606 encloses components within an exterior case. In some implementations the components may be distributed directly within one or more portions of a previously formed exterior case. In other implementations, the components may be encased at least partially in an encapsulating material, for example, a plastic or epoxy. Furthermore, in some implementations, operations 604 and 606 may comprise a single operation, where the components are interconnected via enclosing the components within the exterior case.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims. For example, the methodological acts need not be performed in the order or combinations described herein, and may be performed in any combination of one or more acts.

What is claimed is:

1. A portable electronic book (eBook) reader device comprising:
    a display component having a perimeter; and
    a plurality of active components consuming or storing electrical power, wherein each active component of the portable eBook reader device other than the display component is arranged around at least a portion of the perimeter of the display component and substantially coplanar with the display component.

2. The portable eBook reader device of claim 1, wherein the perimeter of the display component comprises a plurality of edges within a plane defined by a length and a width of the display component.

3. The portable eBook reader device of claim 1, wherein the perimeter of the display component comprises at least four edges, the eBook reader device further comprising a plurality of batteries to provide operational power, such that a first battery is disposed along a first edge of the perimeter of the display component and a second battery is disposed along a second edge.

4. The portable eBook reader device of claim 1, wherein the perimeter of the display component comprises at least four edges, and wherein the plurality of active components are disposed in the following arrangement:
    a wireless module resides adjacent to one of the four edges of the perimeter of the display component;
    a battery resides adjacent to one of the four edges of the perimeter of the display component; and
    a main logic board resides adjacent to one of the four edges of the perimeter of the display component.

5. The portable eBook reader device of claim 1, wherein the plurality of active components comprises:
    a main logic board;
    a wireless module; and
    a battery.

6. The portable eBook reader device of claim 1, wherein the display component comprises an electrophoretic display.

7. The portable eBook reader device of claim 1, wherein the display component resides between two or more components.

8. The portable eBook reader device of claim 1, further comprising an interconnect to couple the display component with at least one of the plurality of active components.

9. The portable eBook reader device of claim 8, wherein the interconnect is integral to at least the display component or one of the plurality of active components.

10. The portable eBook reader device of claim 1, wherein the display component includes at least one of the following:
    a reflective display screen;
    an emissive display screen; and
    a touch input component.

11. A device comprising:
    a display component defining a plane and having a perimeter, wherein a thickness of the device in a direction perpendicular to the plane is based on a thickness of the display component in the direction perpendicular to the plane;
    a circuit board coupled to the display component and disposed approximately within the plane of the display component and along at least a first portion of the perimeter of the display component; and
    one or more batteries coupled to the circuit board and disposed approximately within the plane of the display component and along at least a second portion of the perimeter of the display component.

12. The device of claim 11, wherein the plane of the display component is defined by a length and a width of the display component.

13. The device of claim 11, wherein each component of the device that consumes or stores electrical power, other than the display component, is arranged around at least a portion of the perimeter of the display component and not disposed behind the display component.

14. The device of claim 11, wherein the display component is substantially polygonal.

15. The device of claim 11, further comprising a speaker component disposed along at least a third portion of the perimeter of the display component.

16. The device of claim 11, further comprising a wireless module disposed along at least a third portion of the perimeter of the display component.

17. The device of claim 11, wherein the device embodies a portable electronic book (eBook) reader device.

18. The device of claim 11, wherein the display component comprises an electrophoretic display.

19. The device of claim 11, wherein the circuit board comprises at least one of:
    a processor;
    an image processing unit; or
    an external memory interface.

20. The device of claim 11, wherein the circuit board comprises a wireless modem to establish a wireless wide area networking connection.

21. The device of claim 11, wherein the circuit board couples to at least one of the display component, or the one or more batteries via one or more interconnects.

22. The device of claim 21, wherein the one or more interconnects comprise at least one of:
    an electrical conductor;
    an optical path;
    an electromagnetic waveguide;
    a fluidic channel; or
    a mechanical joint.

23. The device of claim 11, wherein the display component includes at least one of the following:
   a reflective display screen;
   an emissive display screen; and
   a touch input component.

\* \* \* \* \*